United States Patent [19]

Url et al.

[11] 4,297,592
[45] Oct. 27, 1981

[54] INTEGRATABLE DYNAMIC CURRENT SOURCE FOR SEMICONDUCTOR MODULES

[75] Inventors: Karlheinz Url, Munich; Paul W. von Basse, Wolfratshausen, both of Fed. Rep. of Germany

[73] Assignee: Siemens Aktiengesellschaft, Berlin & Munich, Fed. Rep. of Germany

[21] Appl. No.: 66,867

[22] Filed: Aug. 15, 1979

[30] Foreign Application Priority Data

Sep. 7, 1978 [DE] Fed. Rep. of Germany ....... 2839073

[51] Int. Cl.³ .......................... H03K 5/00; H03K 5/22
[52] U.S. Cl. .............................. 307/583; 307/DIG. 3; 307/355
[58] Field of Search ................. 307/DIG. 3, 238, 355

[56] References Cited

U.S. PATENT DOCUMENTS 3,886,468  5/1975  Kruggel ..................... 307/DIG. 3
3,992,704  11/1976  Kantz ........................ 307/DIG. 3
4,003,035  1/1977  Hoffman et al. ............ 307/DIG. 3
4,119,870  10/1978  Zibert ........................ 307/355

Primary Examiner—Harold A. Dixon
Attorney, Agent, or Firm—Hill, Van Santen, Steadman, Chiara & Simpson

[57] ABSTRACT

An integratable dynamic current source for semiconductor modules which generates impressed currents of brief duration and of minimum current magnitude for read-out amplifiers in dynamic MOS memory modules utilizes capacitors integrated on the semiconductor chip and driven by selected voltage pulses and can be employed with a switching transistor to produce a voltage curve having a first portion with a low rate of change and a second portion having a high rate of change with respect to time.

3 Claims, 6 Drawing Figures

FIG 3
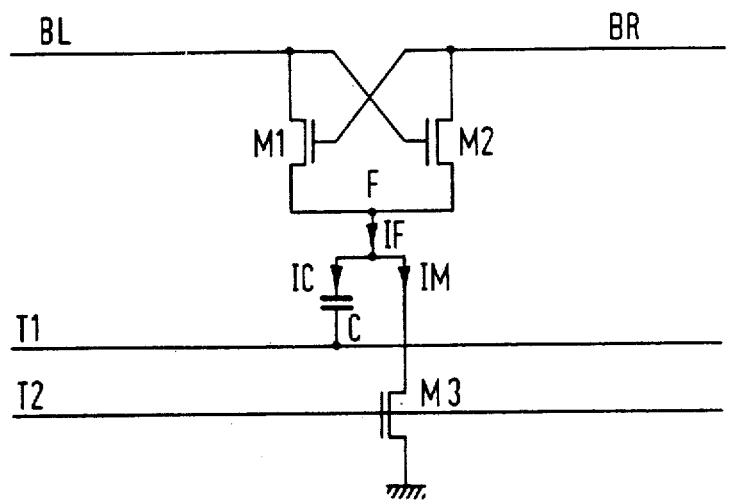
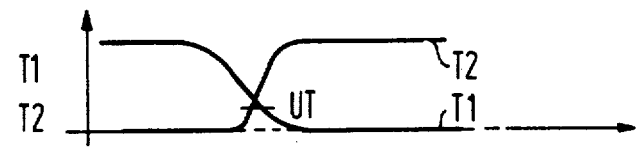
FIG 4 T1 T2
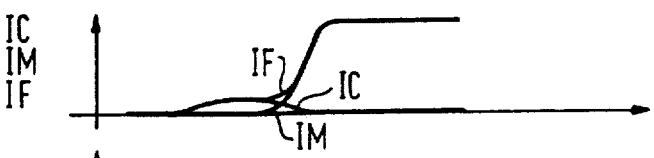
FIG 5 IC IM IF
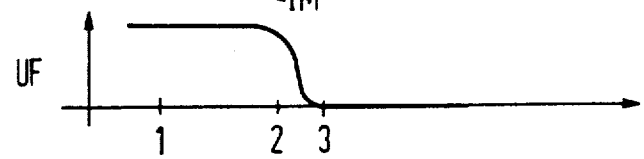
FIG 6 UF

INTEGRATABLE DYNAMIC CURRENT SOURCE FOR SEMICONDUCTOR MODULES

BACKGROUND OF THE INVENTION

1. Field of the Invention:

The present invention relates to current sources for use in semiconductor modules, and in particular to such sources which are integratable on the semiconductor chip and which are capable of producing impressed currents of minimal current magnitude and of brief duration, such as currents particularly suitable for use for read-out amplifiers in dynamic MOS memory modules.

2. Description of the Prior Art and Other Pertinent Patents:

In integrated semiconductor modules small currents are required at many points in the circuit such as, for example, for setting reference levels. Such currents are generally only required briefly and thus must not only be of small magnitude but also of brief duration. Such currents must also be able to be impressed at various points in the circuit exhibiting a number of different potentials.

The conventional method and apparatus for generating such small currents utilize elements having high resistance, for example, elements having long narrow diffusion paths, polysilicon paths, long, narrow MOS transistors, or by means of a series connection of a number of small transistors. All of the above-mentioned elements require a relatively large surface area on the chip, and moreover, because of the requirement that the element have a width which is exceedingly small in comparison with the length of the component, the components are difficult and expensive to manufacture due to the necessity of maintaining precise tolerances.

Further, if the various potentials at the circuit points at which the currents are introduced change during operation of the circuit, a regulated current source is required. Current sources utilizing conventional elements can only be regulated in a complicated expensive manner, which required additional use of chip surface area.

A read-out amplifier circuit for a dynamic MOS memory is described and claimed in German No. OS2623219, corresponding to U.S. Pat. No. 4,119,870 issued on Oct. 10, 1978. The circuit disclosed therein is divided into two portions, a read-out amplifier portion, and a function generator for generating a suitable control pulse for operating the amplifier. The function generator consists basically of a discharge circuit and an invertor circuit, and utilizes a number of field effect transistors thereby requiring a relatively large integration space on the chip.

SUMMARY OF THE INVENTION

It is a primary object of the present invention to provide an integratable dynamic current source for the generation of impressed currents of minimal current magnitude and of brief duration for semiconductor modules, particularly for the generation of currents for read-out amplifiers and dynamic MOS memory modules.

This object is achieved by the construction of a plurality of current sources comprising capacitors integrated on the chip which are driven by edges of a voltage curve.

In a memory module consisting of two switching transistors each having a drain electrode connected to separate bit lines and having respective gate electrodes cross-coupled to the bit lines, the source electrodes of the transistors are connected to a node which is to be charged prior to the beginning of a reading cycle and in order to evaluate a read-out signal, is discharged in a controlled manner so that the switching transistor whose drain electrode is subjected to a voltage change via the bit line which gives rise to a read-out signal is rendered conductive. The present invention provides a control signal by means of a capacitor connected to a first clock pulse line and an additional switching transistor which is driven vie a second clock pulse line with both the capacitor and the additional switching transistor being connected to the control node.

BRIEF DESCRIPTIONS OF THE DRAWINGS

FIG. 3 is a circuit diagram for a read-out amplifier for dynamic MOS memory modules utilizing the current source constructed in accordance with the principles of the present invention.

FIG. 4, FIG. 5 and FIG. 6 are graphic representations of current and voltage curves at various points in the read-out amplifier shown in FIG. 3.

DESCRIPTION OF THE PREFERRED EMBODIMENTS

Figure 1:
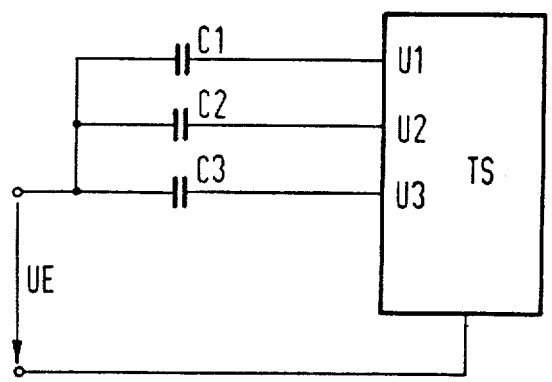
FIG. 1 is a block diagram of a current source constructed in accordance with the principles of the present invention shown in general application.

In order to accurately evaluate the small differential signals of the bit lines in the read-out amplifiers described in U.S. Pat. No. 4,119,870, the amplifiers must be provided with a control voltage having a specifically selected curve. A circuit for producing such a curve is schematically shown in FIG. 1 for general application to an integrated semiconductor module TS. The circuit generally consists of a capacitor serving the function of each required dynamic current sources, shown at C1, C2 and C3 in FIG. 1. It will be understood that any number of such capacitive current sources can be employed, depending on the requirements of the circuit TS.

Figure 2:
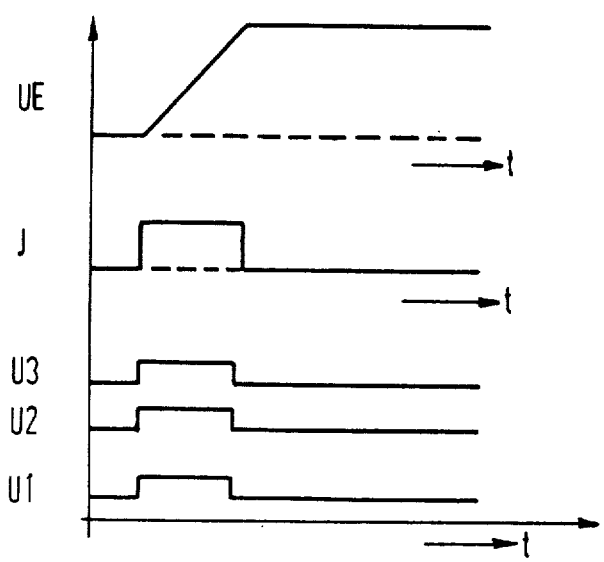
FIG. 2 is a graphic representation of the voltage and current curves at various points in the diagram of FIG. 1.

The capacitors C1, C2, C3 are driven by a common voltage curve UE shown at the top of FIG. 2. With a voltage control such as UE the current curve J, shown in the second line of FIG. 2, results at each input to the circuit TS, which may produce the respective potentials at the input points shown at U1, U2, and U3 in FIG. 2. It will be understood that the particular shape of the potential at the inputs to the circuit TS will be determined by the various parameters associated with the input element. If the input element is a transistor, the input potential will be largely determined by the threshold voltage tolerance of the transistor.

Because the current J is proportional to the magnitude of the pre-connected capacitances, C1, C2, or C3, the area requirement of the capacitors on the integrated circuit chip can be decreased in direct proportion to the current required, so that if, in the case of MOS memory modules, extremely small current is required, the area requirement of the capacitors on the chip will be minimal. By the use of silicon dioxide as the dielectric in the capacitors, the capacitance values can be precisely chosen because the insulator thickness and the surface of the capacitor plates can be closely controlled.

The impression of small currents generated by the current sources, shown in FIG. 1, is particularly suitable for use with read-out amplifiers in dynamic MOS memory modules as shown in FIG. 3. The module shown in FIG. 3 generally corresponds to that disclosed in U.S. Pat. No. 4,119,870.

In such memory modules, two switching transistors M1 and M2 have a control electrode connected to separate bit lines. In the embodiment shown in FIG. 3, the gate electrode of transistor M1 is connected to a bit line BR and the gate electrode of the transistor M2 is connected to a bit line BL. The drain electrode of the transistor M1 is connected to the bit line BL and the drain of transistor M2 is connected to the bit line BR.

The source electrodes of the tranistors M1 and M2 are joined at a node F. A control signal is supplied to node F which must satisfy specific demands for accurate evaluation of the differential signals on the bit lines BL and BR. The derivation of the required voltage curve appearing at the node F is described in detail in U.S. Pat. No. 4,119,870 which briefly summarized results in a voltage curve which has a transition portion between differing voltage levels which initially exhibits a slow rate of change with respect to time which changes to a steeper transistion portion having a large derivitive. Such a curve is shown at UF in FIG. 6. The curve in FIG. 6 has a first high voltage level at a time t1, which exhibits a slow rate of change to a lower voltage level immediately prior to time t2, and has a fast rate of change to a lower voltage level between times t2 and t3.

The realization of a voltage curve UF and the node F is achieved by the use of the capacitive current source described in FIG. 1 in conjunction with a further switching transistor M3. The capacitor C is driving by a clock pulse line T1 and the transistor M3 has a control electrode connected to a second clock pulse line T2. The clock pulse lines T1 and T2 display the voltage curves shown in FIG. 4.

The small decrease in the potential UF immediately prior to time t2 in FIG. 6 is achieved by the impression of a small current IC through the capacitor C as a result of the clock pulse T1. The clock pulse T1 may supply a number of capacitors each associated with a read-out capacitor via lines not illustrated in FIG. 3. The amplifiers may have respective front end potentials of various magnitudes as a result of the threshold voltage tolerance of the MOS transistors forming the inputs thereof. Such a voltage is represented by UT in FIG. 4. The current IC can nonetheless be simultaneously and uniformly impressed at the front ends of each amplifier, analogous to the manner shown in FIG. 1, whereby the evaluation process is thus simultaneously initiated in all read-out amplifiers.

The rapid decrease of the potential UF to a reference potential in the area between times t2 and t3 is achieved by the operation of the third switching transistor M3. The transistor M3 is controlled by the clock pulse T2 which will be switched to a conductive state when T2 reaches a high level, thereby pulling the node F to ground, represented by the current IM. The clock pulse T2 may also be common to a number of read-out amplifiers and becasue of the large derivitive with respect to time in the transition area all transistors M3 will be activated substantially simultaneously despite having slightly different threshold voltages UT.

The currents IC and IM combine to form a node current IF.

In the absence of the capacitor C, the potential curve UF would have to be generated by a selected curve corresponding to the clock pulse voltage T2 at the control electrode of the transistor M3. Producing such a control voltage has several difficulties becasue of the varying threshold voltage tolerances of the transistors M3 utilized with each read-out amplifier. Because of such variances, the transistors M3 could not be simultaneously driven in a weakly conductive manner between the time t1 and t2 even with a clock pulse voltage T2 which is ideal. The largest deviations from a median threshold voltage of the tranisistor M3 would result in a conducting state for those transistors ocurring only in the steep area of the clock pulse voltage T2, ie., times t1 through t2. The pre-amplification phase would thus not occur in the read-out amplifier, so that the amplifiers might falsely evaluate the small differential signals.

Although modifications and changes may be suggested by those skilled in the art it is the intention of the inventors to embody within the patent warranted hereon all changes and modifications as reasonably and properly come within the scope of their contribution to the art.

We claim as our invention:

1. A current source for a read-out amplifier having two transistors cross-coupled to two bit lines of a MOS memory, said transistors having respective source electrodes connected together at a node which is charged before the beginning of a read-out cycle and is successively discharged in a selected manner for the evaluation of a read-out signal, said current source for use with a first and a second clock pulse line and comprising:
   a capacitor connected between the node and the first clock pulse line;
   a switching transistor having a control electrode connected to the second clock pulse line and having a first terminal connected to said node and a second terminal connected to a reference potential;
   said first clock pulse line providing a voltage signal during each read-out cycle which changes from a high voltage level to a reference voltage level;
   said second clock pulse line providing a voltage signal during each read-out cycle changing from a reference potential level to a high potential level;
   said capacitor and said switching transistor operating in combination to provide a voltage signal at said node during each read-out cycle, said signal changing from a high potential to a reference potential through a transition portion of said signal, said transistion portion having an initial region of slow transition having a low slope followed by a region of rapid transition having a high slope.

2. The current source of claim 1 wherein each of said capacitors has a dielectric comprised of silicon dioxide.

3. A read-out amplifier for a dynamic MOS memory module, said module having first and second bit lines, said amplifier being controlled by first and second clock pulse lines and comprising:
   a first field effect transistor having a gate region connected to said first bit line and a drain region connected to said second bit line;
   a second field effect transistor having a gate region connected to said second bit line and a drain region connected to said first bit line, said fist and second field effect transistors each having a source region and said source regions being connected at a common node;

a capacitor connected between said node and said first clock pulse line;

a third field effect transistor having a drain region connected to said node, a gate region connected to said second clock pulse line, and a source region connected to said reference potential;

said first clock pulse line providing a voltage signal during each read-out cycle which changes from a high voltage level to said reference potential level;

said second clock pulse line providing a voltage signal during each read-out cycle starting at said reference potential and changing to a high voltage level;

said capacitor and said third transistor operating in combination to provide a voltage signal at said node during each read-out cycle having a high voltage level and a reference voltage level with a transition period between said levels with said third transistor initially non-conducting to allow said capacitor to slowly move said node potential toward said reference potential, and said second clock pulse line subsequently operating to change said third transistor to a conducting state to rapidly bring said node to said reference potential.

* * * * *